United States Patent
Reinmuth et al.

(10) Patent No.: US 11,214,482 B2
(45) Date of Patent: Jan. 4, 2022

(54) MICROMECHANICAL DEVICE INCLUDING A COVERING BOND FRAME

(71) Applicant: Robert Bosch GmbH, Stuttgart (DE)

(72) Inventors: Jochen Reinmuth, Reutlingen (DE); Martin Rambach, Pliezhausen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/648,365

(22) PCT Filed: Oct. 4, 2018

(86) PCT No.: PCT/EP2018/077010
§ 371 (c)(1),
(2) Date: Mar. 18, 2020

(87) PCT Pub. No.: WO2019/072679
PCT Pub. Date: Apr. 18, 2019

(65) Prior Publication Data
US 2020/0223685 A1  Jul. 16, 2020

(30) Foreign Application Priority Data

Oct. 11, 2017  (DE) .......................... 102017218155.9

(51) Int. Cl.
*B81B 7/00* (2006.01)
*B81B 3/00* (2006.01)
(Continued)

(52) U.S. Cl.
CPC .......... *B81B 7/0032* (2013.01); *B81B 3/0051* (2013.01); *B81B 7/02* (2013.01);
(Continued)

(58) Field of Classification Search
CPC ....... B81B 7/0032; B81B 3/0051; B81B 7/02; B81B 2201/02; B81B 2203/0315; B81B 7/0077; B81C 1/00; B81C 2203/0109
See application file for complete search history.

(56) References Cited

U.S. PATENT DOCUMENTS

2013/0193527 A1* 8/2013 Chu ........................ B81B 7/007
257/414
2014/0374856 A1* 12/2014 Chen ...................... B81B 3/0005
257/418

(Continued)

FOREIGN PATENT DOCUMENTS

TW           201730094 A        9/2017

OTHER PUBLICATIONS

International Search Report for PCT/EP2018/077010, dated Jan. 9, 2019.

*Primary Examiner* — Yasser A Abdelaziez
(74) *Attorney, Agent, or Firm* — Norton Rose Fulbright US LLP; Gerard Messina

(57) ABSTRACT

A micromechanical device that includes a substrate, a functional layer, and a cap that are situated one above the other in parallel to a main plane of extension. A cavity that is surrounded by a bond frame that extends in parallel to the main plane of extension is formed in the functional layer, the cap being connected to the bond frame. The cavity is situated partially between the bond frame and the substrate in a direction perpendicular to the main plane of extension. A method for manufacturing a micromechanical device is also provided.

8 Claims, 2 Drawing Sheets

(51) Int. Cl.
   *B81B 7/02*   (2006.01)
   *B81C 1/00*   (2006.01)
(52) U.S. Cl.
   CPC ............ *B81C 1/00* (2013.01); *B81B 2201/02* (2013.01); *B81B 2203/0315* (2013.01); *B81C 2203/0109* (2013.01)

(56) References Cited

U.S. PATENT DOCUMENTS

| | | | |
|---|---|---|---|
| 2015/0158718 A1* | 6/2015 | Reinmuth | B81B 7/007 257/415 |
| 2015/0198493 A1* | 7/2015 | Kaelberer | B81B 3/0037 73/718 |
| 2016/0167952 A1 | 6/2016 | Bowles et al. | |
| 2017/0210618 A1* | 7/2017 | Chang | B81B 3/0021 |
| 2018/0202982 A1* | 7/2018 | Fain | G01N 30/66 |

* cited by examiner

MICROMECHANICAL DEVICE INCLUDING A COVERING BOND FRAME

FIELD

The present invention is directed to a micromechanical device that includes a substrate, a functional layer, and a cap that are situated one above the other in parallel to a main plane of extension, a cavity that is surrounded by a bond frame that extends in parallel to the main plane of extension being formed in the functional layer, the cap being connected to the bond frame.

BACKGROUND INFORMATION

MEMS elements require capping to shield the sensitive measuring structures from unwanted environmental influences such as particles or moisture. According to the related art, the cap is connected to the MEMS element (sensor) via a bond connection. Typical methods are seal glass bonding and eutectic bonding. However, other bonding methods are also used for this connection.

All bonding methods share the common feature that a circumferential area around the sensor, in which the bond connection between the cap and the MEMS element takes place, must be kept free. This area is referred to as a bond frame. Significant efforts have been undertaken to reduce the width of the bond frame and thus, to decrease the required chip surface area and thus lower the costs.

Reducing the chip surface area while maintaining the bond frame width results in an increasingly greater percentage of the bond frame surface area in relation to the total chip surface area.

The chip surface area used for the sensor element must thus be disproportionately reduced in order to decrease the overall chip surface area by the desired percentage.

However, the width of the bond frame cannot be arbitrarily reduced, since many properties of the bond connection differ from the intrinsic properties of the cap and of the MEMS element. Thus, the strength, the chemical resistance, and the tightness of the bond connection are generally less than that of the cap and of the MEMS element. The bond frame width is thus usually limited by the properties of the bond connection. For this reason, considerable effort is normally put into optimizing the properties of the bond connection. The present invention presents one option for how the overall chip size may be reduced while maintaining the bond frame width and the bond properties, at the same time with a minimal reduction in the surface area for the sensor element. Another disadvantage of the related art is that for the movable MEMS structures, for the movement out of the substrate plane a stop concept is generally used that provides stops in the cap. The possible spacings, the variation of the spacings, and the position of these stops are a function of the bond connection, and therefore are subject to a large number of limitations.

A further disadvantage of the related art is that a cap having a complicated structure is necessary.

SUMMARY

The present invention allows reduction of the chip surface area, at the same time with a minimal reduction in the surface area of the sensor element.

An example embodiment of the present invention includes a micromechanical device that includes a substrate, a functional layer, and a cap that are situated one above the other in parallel to a main plane of extension, a cavity that is surrounded by a bond frame that extends in parallel to the main plane of extension being formed in the functional layer, the cap being connected to the bond frame. In accordance with the present invention, the cavity is situated partially between the bond frame and the substrate in a direction perpendicular to the main plane of extension.

In accordance with an advantageous example embodiment of the device according to the present invention, a micromechanical structure is provided that is situated in the cavity and is formed in the functional layer, and the micromechanical structure is situated partially between the bond frame and the substrate in a direction perpendicular to the main plane of extension. In this way, maximum use may be made of the chip surface area for the micromechanical structure. One advantageous embodiment of the device according to the present invention provides that an intermediate layer, in particular a polysilicon layer, is situated above the functional layer and below the bond frame. The bond frame may be advantageously placed on this intermediate layer.

Moreover, the present invention relates to a method for manufacturing a micromechanical device, including the steps:
(A) providing a substrate;
(B) creating a functional layer on the substrate;
(C) depositing an oxide layer on the functional layer;
(D) depositing an intermediate layer on the oxide layer;
(E) removing portions of the intermediate layer, the intermediate layer remaining at least in the area of a bond frame;
(F) removing the oxide layer, a cavity being created that partially extends between the intermediate layer in the area of the bond frame and the functional layer;
(G) bonding a cap onto the bond frame.

One advantageous embodiment of the method according to the present invention provides that a polysilicon layer is deposited as the intermediate layer. It is also advantageous that a micromechanical structure is formed in the functional layer after step (B) and before step (C), and this micromechanical structure is covered with oxide in step (C). It is particularly advantageous that a depression is etched into the oxide in the area of the bond frame after step (C) and before step (D), the depression being filled with material of the intermediate layer in step (D) in order to produce a stop for the micromechanical structure below the bond frame.

The present invention advantageously results in a decoupling of the chip size from the bond frame width, in particular for micromechanical sensors that include movable micromechanical structures, the actual sensor elements. This is achieved by situating the bond frame above the sensor element and moving a portion of the sensor element beneath the bond frame. The bond frame surface may thus be used for multiple functions at the same time. When the chip size of a sensor chip is reduced, this allows the actual sensor element to have a larger design, which allows improved performance of the sensor, for example with regard to noise. On the other hand, for a desired performance (and surface area) of the sensor the chip surface area may be additionally reduced, since portions of the sensor are implemented below the bond frame. This allows an additional reduction in the chip surface area, and thus a further reduction in the manufacturing costs. In addition, the bond frame may be greatly increased in size, resulting in increased resistance of the bond frame without at the same time increasing the chip surface area, or allows use of more favorable bonding methods, which allows less strength, even for very small components. Thus, for example, a complicated, costly eutectic bond connection may be replaced by a simpler seal glass bonding method. In addition, a better, more accurate stop concept is possible with this concept.

The present invention may be used for a wide spectrum of sensors. These include, among others, acceleration sensors, rotation rate sensors, combined elements (an acceleration sensor and a rotation rate sensor on one chip), as well as further innovative sensors that aim for a reduction in the chip surface area or a reduction in the manufacturing costs. This approach is of great importance, in particular for concepts with an ASIC that simultaneously functions as a cap for the MEMS component.

With such concepts, previously it has been necessary to very closely coordinate the ASIC surface area and the MEMS surface area so as not to result in additional costs. With the approach according to the present invention, a larger MEMS core may be built, on the same base surface, with a moderate amount of additional effort. Thus, on the one hand flexibility with regard to the surface area ratio of the ASIC to the MEMS is obtained, and on the other hand, the installation size of the overall component may be reduced.

DETAILED DESCRIPTION OF EXAMPLE EMBODIMENTS

Figure 1:
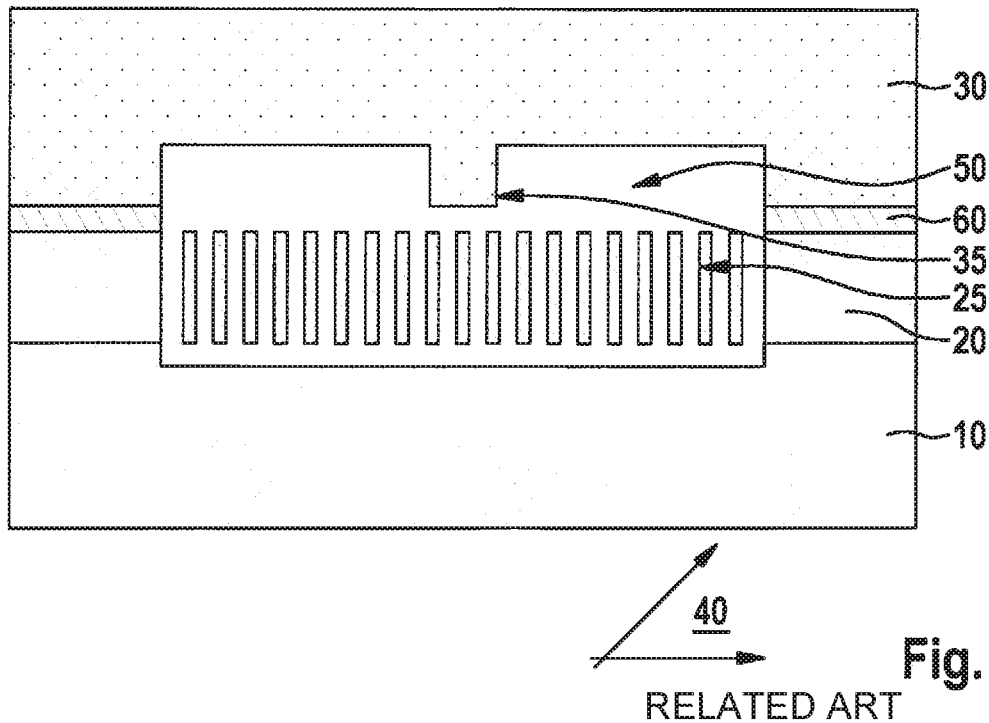
FIG. 1 shows a micromechanical device from the related art that includes a substrate, a micromechanical structure, a bond frame, and a cap.
Figure 2:
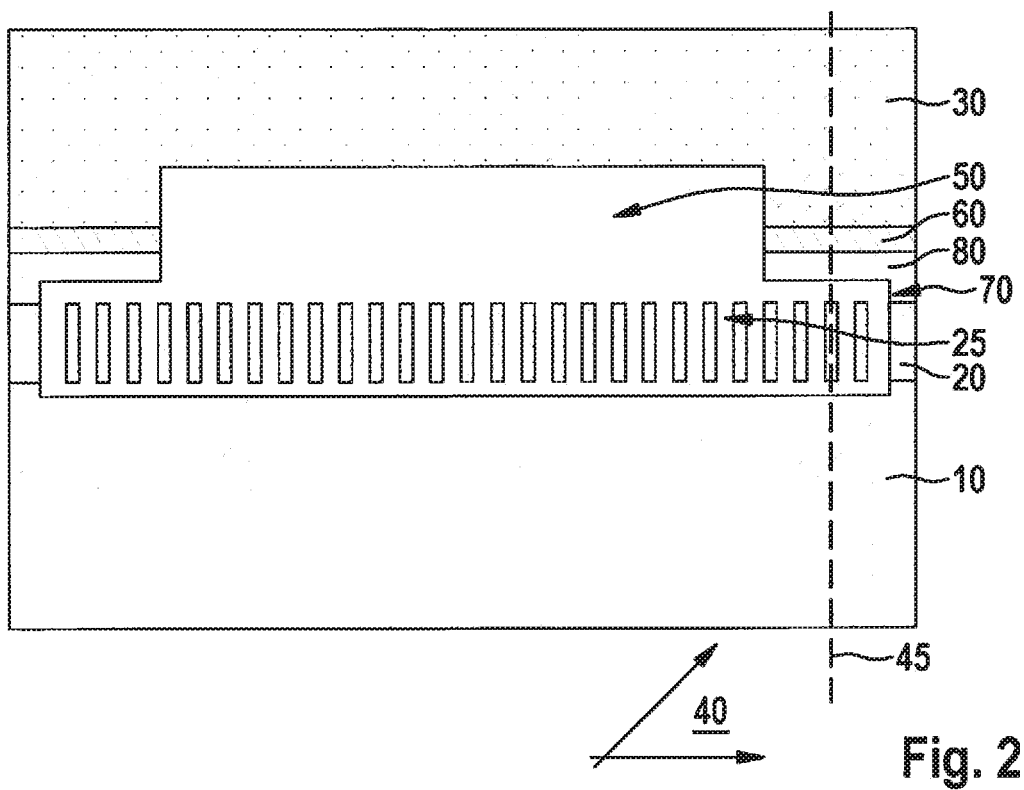
FIG. 2 shows a micromechanical device according to the present invention that includes a substrate, a micromechanical structure, a covering bond frame, and a cap.

FIGS. 1 and 2 illustrate a schematic comparison of a micromechanical device from the related art and a micromechanical device according to the present invention that includes a covering bond frame, in cross section.

FIG. 1 shows a micromechanical device from the related art that includes a substrate, a micromechanical structure, a bond frame, and a cap. A micromechanical device that includes a substrate 10, a functional layer 20, and a cap 30, which are situated one above the other in parallel to a main plane of extension, are illustrated. A cavity 50 that is surrounded by a bond frame 60 is formed in functional layer 20. A micromechanical structure 25 is also formed in functional layer 20. Cap 30 is connected to bond frame 60. Cap 30 includes a cap stop 35 for limiting a deflection of functional layer 20 perpendicular to main plane of extension 40.

FIG. 2 shows a micromechanical device according to the present invention that includes a substrate, a micromechanical structure, a covering bond frame, and a cap. In contrast to the device shown in FIG. 1, in the present case cavity 50 is partially situated between bond frame 60 and substrate 10 in a direction 45 perpendicular to main plane of extension 40. This means that cavity 50 in part also extends beneath bond frame 60. Likewise, in the present exemplary embodiment, micromechanical structure 25 also extends in part beneath bond frame 60. Beneath the bond frame there is only enough space for a bonding web 70, which is narrower than bond frame 60 in a direction in parallel to main plane of extension 40.

In one preferred exemplary embodiment, the micromechanical device is designed as a micromechanical sensor. The bonding web at the level of the sensor core is narrower than the bond frame. The sensor core protrudes in portions beneath the bond frame. An intermediate layer, preferably a polysilicon layer, is situated in the bond frame area above the sensor core. In the event of overload, the sensor core preferably strikes the bottom side of the bond frame area. Stop knobs are optionally situated on the bottom side of the bond frame area. The cap wafer may include a sensor cavity in order to achieve a preferably large volume. In one cost-effective specific embodiment, a sensor cavity may be dispensed with. In one particularly compact variant, the cap may be replaced by an evaluation ASIC. Electrical connections that connect the sensor core to the ASIC are provided in the sensor cavity. In one preferred variant, these contacts are produced in the same way, together with the bond frame.

Figure 3:
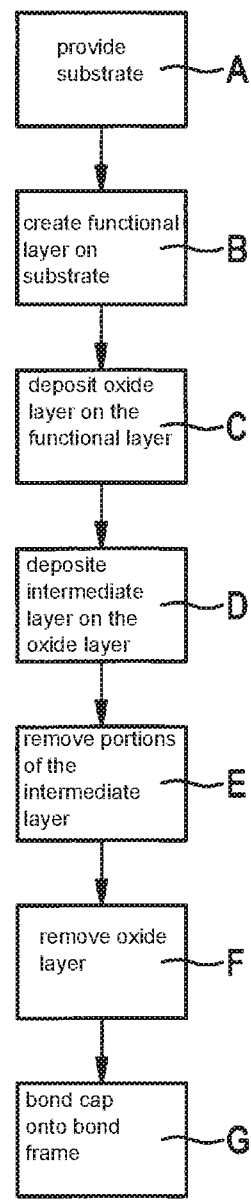
FIG. 3 schematically shows a method for manufacturing a micromechanical device that includes a substrate, a micromechanical structure, a covering bond frame, and a cap.

FIG. 3 schematically shows a method for manufacturing a micromechanical device that includes a substrate, a micromechanical structure, a covering bond frame, and a cap. The method includes at least the steps:

(A) providing a substrate;
(B) creating a functional layer on the substrate;
(C) depositing an oxide layer on the functional layer;
(D) depositing an intermediate layer on the oxide layer;
(E) removing portions of the intermediate layer, the intermediate layer remaining at least in the area of a bond frame;
(F) removing the oxide layer, a cavity being created that partially extends between the intermediate layer in the area of the bond frame and the functional layer;
(G) bonding a cap onto the bond frame.

In one exemplary embodiment, a micromechanical sensor is manufactured. A sensor element is created on a substrate. The sensor element is filled with at least one oxide deposit. In one particularly advantageous variant, the creation of the sensor element and the oxide deposition are carried out in such a way that cavities are formed that extend below the subsequent bond frame. Optionally, in the bond frame area a depression is etched into the oxide in order to create stops below the bond frame area. Contact etching into the oxide is optionally carried out. In one preferred exemplary embodiment, the contact web includes the entire sensor core. A layer deposition of an intermediate layer is carried out. A polysilicon layer is preferably deposited. One or multiple components of the bond connection are optionally deposited and structured. The polysilicon layer is etched. The sensor core is exposed using a sacrificial layer etching method. An etching step that operates with gaseous HF is preferably used. Below the bond frame, the oxide is evacuated in an accelerated manner in a horizontal direction through the cavities. A cap wafer is provided and bonded onto the sensor wafer.

What is claimed is:

1. A micromechanical device, comprising:
a substrate, a functional layer, and a cap, that are situated one above the other in parallel to a main plane of extension of the micromechanical device;
a bond frame, a cavity that is surrounded by the bond frame extends in parallel to the main plane of extension, the cavity being formed in the functional layer;
wherein the cap is connected to the bond frame, and wherein the cavity is situated partially above the bond frame in a direction perpendicular to the main plane of extension and partially between the bond frame and the substrate in the direction perpendicular to the main plane of extension, wherein a bonding web is situated beneath the bond frame, wherein the bonding web is narrower than the bond frame in a direction in parallel to the main plane of extension.

2. The micromechanical device as recited in claim 1, wherein a micromechanical structure is situated in the cavity and is formed in the functional layer, and the micromechanical structure is situated partially between the bond frame and the substrate in the direction perpendicular to the main plane of extension.

3. The micromechanical device as recited in claim 1, wherein an intermediate layer is situated above the functional layer and below the bond frame.

4. The micromechanical device as recited in claim 3, wherein the intermediate layer is a polysilicon layer.

5. A method for manufacturing a micromechanical device, comprising the following steps:
(A) providing a substrate;
(B) creating a functional layer on the substrate;
(C) depositing an oxide layer on the functional layer;
(D) depositing an intermediate layer on the oxide layer;
(E) removing portions of the intermediate layer, the intermediate layer remaining at least in an area of a bond frame;
(F) removing the oxide layer, a cavity being created that partially extends between the intermediate layer in the area of the bond frame and the functional layer; and
(G) bonding a cap onto the bond frame.

6. The method for manufacturing a micromechanical device as recited in claim 5, wherein a polysilicon layer is deposited as the intermediate layer.

7. The method for manufacturing a micromechanical device as recited in claim 5, wherein a micromechanical structure is formed in the functional layer after step (B) and before step (C), and the micromechanical structure is covered with oxide in step (C).

8. The method for manufacturing a micromechanical device as recited in claim 7, wherein a depression is etched into the oxide in the area of the bond frame after step (C) and before step (D), the depression being filled with material of the intermediate layer in step (D) to produce a stop for the micromechanical structure below the bond frame.

\* \* \* \* \*